(12) United States Patent
Herdendorf et al.

(10) Patent No.: US 11,105,847 B1
(45) Date of Patent: Aug. 31, 2021

(54) DATA STORAGE COMPONENT TEST SOCKET OPENER

(71) Applicant: Seagate Technology LLC, Cupertino, CA (US)

(72) Inventors: Brett R. Herdendorf, Mound, MN (US); Ronald E. Anderson, Lakeville, MN (US)

(73) Assignee: Seagate Technology LLC, Fremont, CA (US)

( * ) Notice: Subject to any disclaimer, the term of this patent is extended or adjusted under 35 U.S.C. 154(b) by 119 days.

(21) Appl. No.: 16/436,141

(22) Filed: Jun. 10, 2019

Related U.S. Application Data

(60) Provisional application No. 62/686,568, filed on Jun. 18, 2018.

(51) Int. Cl.
   *G01R 31/28* (2006.01)

(52) U.S. Cl.
   CPC ...... *G01R 31/2887* (2013.01); *G01R 31/2889* (2013.01); *G01R 31/2893* (2013.01)

(58) Field of Classification Search
   CPC ............ G01R 31/2887; G01R 31/2893; G01R 31/2889
   USPC ........................................ 324/756.02, 757.01
   See application file for complete search history.

(56) References Cited

U.S. PATENT DOCUMENTS

| | | | |
|---|---|---|---|
| 5,062,018 A | 10/1991 | Yaeger | |
| 5,303,105 A | 4/1994 | Jorgenson | |
| 5,310,039 A * | 5/1994 | Butera | G01R 31/2893 198/346.2 |
| 5,379,229 A * | 1/1995 | Parsons | B65G 1/1378 414/273 |
| 5,463,514 A | 10/1995 | Yaeger | |
| 5,572,387 A * | 11/1996 | Brooks, Jr. | G11B 5/486 360/244.3 |
| 6,008,636 A * | 12/1999 | Miller | G01R 31/01 324/757.01 |
| 6,134,085 A | 10/2000 | Wong et al. | |
| 6,411,584 B2 * | 6/2002 | Davis | G11B 11/10543 369/256 |
| 6,459,260 B1 * | 10/2002 | Bonin | G11B 5/4853 29/603.03 |
| 6,507,462 B1 * | 1/2003 | Gibbs | G11B 5/6005 360/264.7 |

(Continued)

FOREIGN PATENT DOCUMENTS

| | | |
|---|---|---|
| JP | 2004-118994 A | 4/2004 |
| JP | 2004-227656 A | 8/2004 |

(Continued)

*Primary Examiner* — Patrick Assouad
*Assistant Examiner* — Sean Curtis
(74) *Attorney, Agent, or Firm* — Faegre Drinker Biddle & Reath LLP

(57) ABSTRACT

An opener assembly for a data storage component testing system is disclosed. The opener assembly includes an actuator assembly with a first opener actuator and a body having a distal end, a proximal end, a first arm, and a second arm. The first and second arms extend between the proximal end and the distal end and define a spacing at the distal end. The first opener actuator is operatively coupled to the first and second arms and configured to actuate the actuator assembly between a closed position and an opened position.

20 Claims, 16 Drawing Sheets

(56) References Cited

U.S. PATENT DOCUMENTS

| | | | |
|---|---|---|---|
| 6,535,357 B1* | 3/2003 | Misso | G11B 5/54 360/256.2 |
| 6,903,543 B2* | 6/2005 | Boutaghou | G01R 31/2829 324/73.1 |
| 6,943,971 B2 | 9/2005 | Kainuma et al. | |
| 7,049,809 B2* | 5/2006 | Luo | G11B 5/102 324/210 |
| 7,091,737 B2* | 8/2006 | Norris | G01R 31/2868 324/750.05 |
| 7,203,018 B1* | 4/2007 | Kummli | G11B 5/5521 360/75 |
| 7,453,670 B2 | 11/2008 | Takanuki et al. | |
| 7,471,081 B2 | 12/2008 | Kainuma et al. | |
| 7,497,006 B2* | 3/2009 | Davis | G11B 5/4826 29/603.03 |
| 7,652,848 B2* | 1/2010 | Hagiya | G11B 5/4826 360/245.7 |
| 7,663,844 B2* | 2/2010 | Song | G11B 5/4813 360/266 |
| 7,719,796 B2 | 5/2010 | Takahashi et al. | |
| 7,889,460 B2* | 2/2011 | Hanya | G11B 5/4826 360/245.3 |
| 7,908,029 B2* | 3/2011 | Slocum, III | B25J 9/0093 700/214 |
| 7,929,303 B1* | 4/2011 | Merrow | G11B 33/128 361/695 |
| 7,987,018 B2* | 7/2011 | Polyakov | G11B 27/36 700/214 |
| 8,086,343 B2* | 12/2011 | Slocum, III | B25J 9/0093 700/214 |
| 8,089,730 B1* | 1/2012 | Pan | G11B 5/4853 360/244.8 |
| 8,095,234 B2* | 1/2012 | Polyakov | G11B 27/36 700/214 |
| 8,134,804 B2* | 3/2012 | Honzawa | G11B 5/4833 360/245.3 |
| 8,243,392 B2* | 8/2012 | Wakahara | G11B 5/4826 360/245 |
| 8,248,730 B2* | 8/2012 | Wakahara | G11B 5/4826 360/245.3 |
| 8,270,117 B2* | 9/2012 | Wakahara | G11B 5/4826 360/245.3 |
| 8,300,361 B2* | 10/2012 | Boutaghou | G11B 5/455 360/240 |
| 8,339,747 B1* | 12/2012 | Hales | G11B 5/5569 360/245.2 |
| 8,379,348 B2* | 2/2013 | Boutaghou | G11B 5/455 360/240 |
| 8,395,864 B2* | 3/2013 | Boutaghou | G11B 5/455 360/240 |
| 8,405,971 B2* | 3/2013 | Merrow | G06F 1/187 361/679.34 |
| 8,467,180 B2* | 6/2013 | Merrow | G11B 17/225 361/679.34 |
| 8,514,522 B1 | 8/2013 | Pan et al. | |
| 8,549,912 B2* | 10/2013 | Merrow | G11B 33/128 73/431 |
| 8,712,580 B2* | 4/2014 | Polyakov | G11B 17/225 700/218 |
| 8,861,140 B1 | 10/2014 | Chen et al. | |
| 8,947,651 B1 | 2/2015 | Thongrattana et al. | |
| 9,001,456 B2* | 4/2015 | Campbell | G11B 33/128 360/92.1 |
| 9,138,895 B2* | 9/2015 | Melikian | B25J 19/023 |
| 9,202,512 B2* | 12/2015 | Bi | H02K 3/26 |
| 9,401,164 B1 | 7/2016 | Thongrattana et al. | |
| 9,412,411 B1 | 8/2016 | Rancour et al. | |
| 9,449,643 B1* | 9/2016 | Rancour | G11B 20/1816 |
| 9,514,781 B2* | 12/2016 | Anderson | G11B 19/048 |
| 9,715,896 B2 | 7/2017 | Rancour et al. | |
| 9,715,897 B2 | 7/2017 | Rancour et al. | |
| 9,858,954 B1 | 1/2018 | Saiki et al. | |
| 10,424,327 B1* | 9/2019 | Mata | G11B 5/3189 |
| 2002/0114108 A1 | 8/2002 | Bement et al. | |
| 2003/0085160 A1* | 5/2003 | Shim | G01R 31/2887 209/573 |
| 2004/0036994 A1 | 2/2004 | Kainuma et al. | |
| 2006/0012360 A1* | 1/2006 | Luo | G11B 5/40 324/754.03 |
| 2006/0072245 A1 | 4/2006 | Motonishi et al. | |
| 2006/0236527 A1 | 10/2006 | Davis et al. | |
| 2007/0002494 A1 | 1/2007 | Takahashi et al. | |
| 2007/0047151 A1* | 3/2007 | Song | G11B 5/4813 360/266 |
| 2007/0183096 A1* | 8/2007 | Hagiya | G11B 5/455 360/245.7 |
| 2007/0263325 A1* | 11/2007 | Hanya | G11B 5/4826 360/245.3 |
| 2009/0146653 A1 | 6/2009 | Kainuma et al. | |
| 2009/0153993 A1* | 6/2009 | Garcia | G11B 5/4555 360/31 |
| 2009/0153994 A1* | 6/2009 | Merrow | G06F 1/187 360/31 |
| 2009/0251825 A1* | 10/2009 | Honzawa | G11B 5/4853 360/245.3 |
| 2009/0265032 A1* | 10/2009 | Toscano | G11B 33/12 700/218 |
| 2009/0297328 A1* | 12/2009 | Slocum, III | B25J 9/0093 414/806 |
| 2011/0007424 A1* | 1/2011 | Wakahara | G11B 5/4826 360/244.2 |
| 2011/0012631 A1* | 1/2011 | Merrow | G11B 33/144 324/750.03 |
| 2011/0012632 A1* | 1/2011 | Merrow | G11B 19/048 324/750.03 |
| 2011/0064546 A1* | 3/2011 | Merrow | G11B 33/142 414/226.05 |
| 2011/0205670 A1* | 8/2011 | Wakahara | G11B 5/4826 360/256 |
| 2011/0267719 A1* | 11/2011 | Wakahara | G11B 5/50 360/256.5 |
| 2012/0008225 A1* | 1/2012 | Boutaghou | G11B 5/455 360/31 |
| 2012/0023370 A1* | 1/2012 | Truebenbach | G11B 27/36 714/27 |
| 2012/0033318 A1* | 2/2012 | Boutaghou | G11B 5/455 360/31 |
| 2014/0015559 A1* | 1/2014 | Lee | G11C 29/56016 324/756.02 |
| 2014/0306728 A1* | 10/2014 | Arena | G01R 31/2808 324/750.08 |
| 2015/0146322 A1* | 5/2015 | Bi | G11B 27/324 360/99.08 |
| 2015/0355231 A1* | 12/2015 | Rogel-Favila | G01R 31/2801 324/750.13 |
| 2015/0355268 A1* | 12/2015 | Rogel-Favila | G01R 31/2893 324/750.08 |
| 2016/0314813 A1* | 10/2016 | Anderson | G11B 19/048 |
| 2016/0314815 A1* | 10/2016 | Anderson | G11B 25/043 |
| 2018/0240480 A1* | 8/2018 | Zambri | G11B 5/4555 |
| 2018/0259572 A1* | 9/2018 | Su | G01R 31/2834 |
| 2019/0279669 A1* | 9/2019 | Mata | G11B 5/4826 |
| 2020/0100940 A1* | 4/2020 | Brennan | A61B 3/16 |
| 2020/0105296 A1* | 4/2020 | Zambri | G11B 5/455 |
| 2020/0108951 A1* | 4/2020 | Cahoy | F03G 7/065 |

FOREIGN PATENT DOCUMENTS

| | | |
|---|---|---|
| JP | 2007-012170 A | 1/2007 |
| JP | 2009-230814 A | 10/2009 |
| JP | 2011-108301 A | 6/2011 |
| JP | 2011-187105 A | 9/2011 |
| WO | 20021100156 A2 | 12/2002 |
| WO | 20051006332 A1 | 1/2005 |
| WO | 2006/116047 A2 | 11/2006 |
| WO | 2012/009163 A1 | 1/2012 |
| WO | 2013/023074 A1 | 2/2013 |

* cited by examiner

DATA STORAGE COMPONENT TEST SOCKET OPENER

CROSS REFERENCE TO RELATED APPLICATION

This application claims the benefit of U.S. Provisional Patent Application No. 62/686,568, filed on Jun. 18, 2018, the entirety of which is hereby incorporated by reference for all purposes.

TECHNICAL FIELD

Certain embodiments of the present disclosure are directed to devices and methods for use with data storage component testing systems.

BACKGROUND

Data storage component testing systems can test performance of one or more individual data storage components such as sliders and data storage media used in hard disk drives. Example data storage component testing systems include spin stands and test decks, which enable simultaneous testing of individual data storage components that are to be later installed in hard disk drives. Certain embodiments of the present disclosure are directed to methods and devices that assist with coupling and decoupling data storage components in testing systems.

SUMMARY

In certain embodiments, an opener assembly for a data storage component testing system is disclosed. The opener assembly includes an actuator assembly with a body and a first opener actuator. The body has a distal end, a proximal end, a first arm, and a second arm. The first and second arms extend between the proximal end and the distal end and define a spacing at the distal end. The first opener actuator is operatively coupled to the first and second arms and configured to actuate the actuator assembly between a closed position and an opened position.

In certain embodiments, a data storage component testing system comprises a test deck including a slider test socket with a clamp and an opener assembly including a first arm and a second arm configured to open and close the clamp.

In certain embodiments, a method for using an opener assembly to couple a slider to a clamp of a slider test socket is disclosed. The opener assembly includes an actuator coupled to a first arm and a second arm. The first and the second arms include a spacing between respective distal ends of the first and second arms. The method includes actuating the actuator to increase the spacing between respective distal ends of the first and second arms and to engage and open the clamp; inserting the slider into the opened clamp; and releasing the actuator to couple the slider to the clamp.

Figure 1:
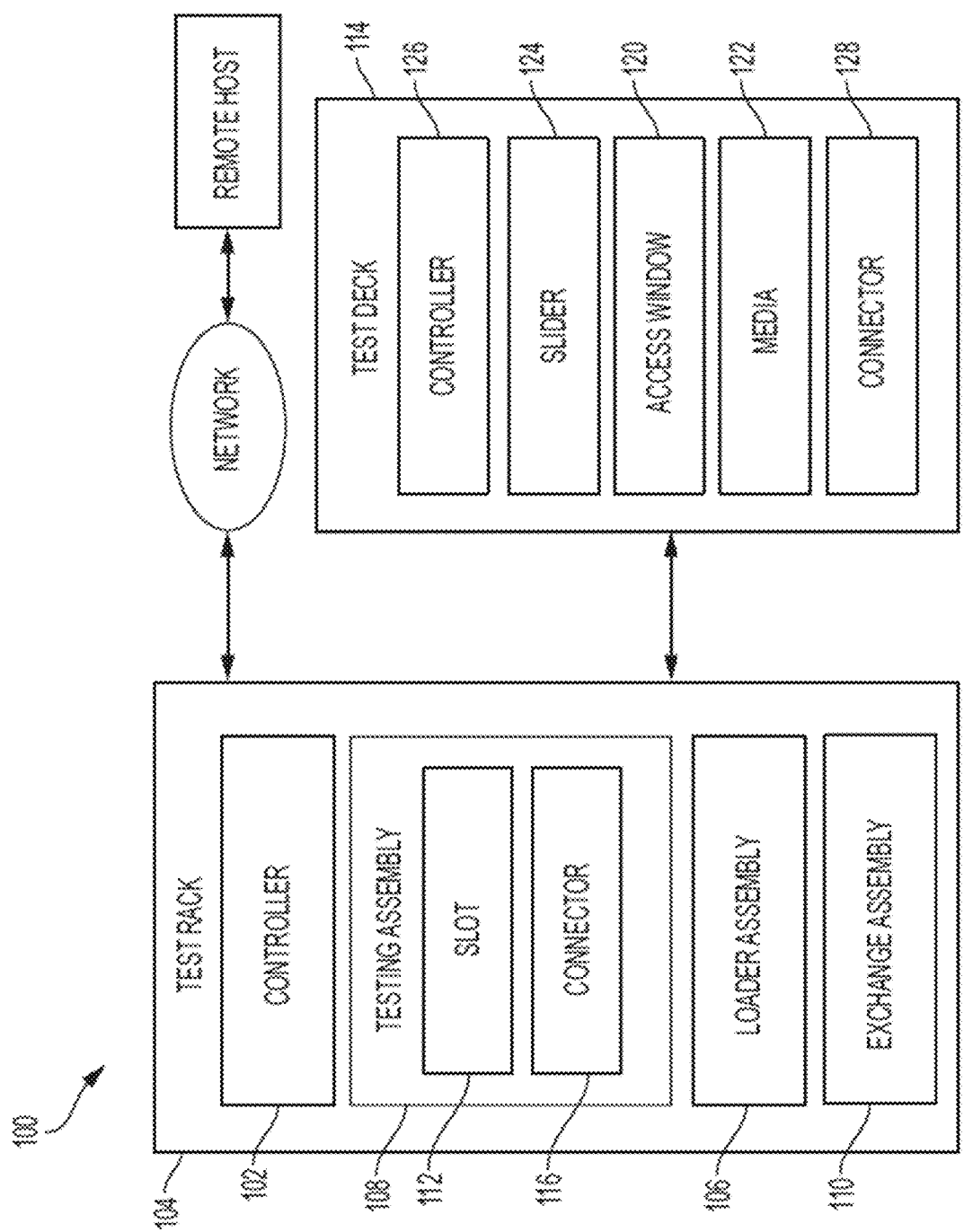
FIG. 1 shows a schematic of a data storage component testing system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Certain embodiments of the present disclosure are directed to devices and methods for use with data storage component testing systems. Example data storage component testing systems include spin stands and other test systems such as those disclosed in U.S. Pat. No. 9,449,643 (hereinafter "the '643 patent"), which is hereby incorporated by reference in its entirety.

FIG. 1 is a schematic representation of a data storage component testing system 100 having a controller 102, a test rack 104, a loader assembly 106, a testing assembly 108, and an exchange assembly 110. The testing assembly 108 has a plurality of test slots 112 that can be arranged vertically and horizontally to efficiently occupy physical space and connectors 116 (e.g., electrical connectors). The testing slots 112 are sized such that the data storage component testing system 100 can simultaneously provide different testing environments for data storage components corresponding with different hard drive form factors, such as 2.5" and 3.5" hard drives.

Figure 2:
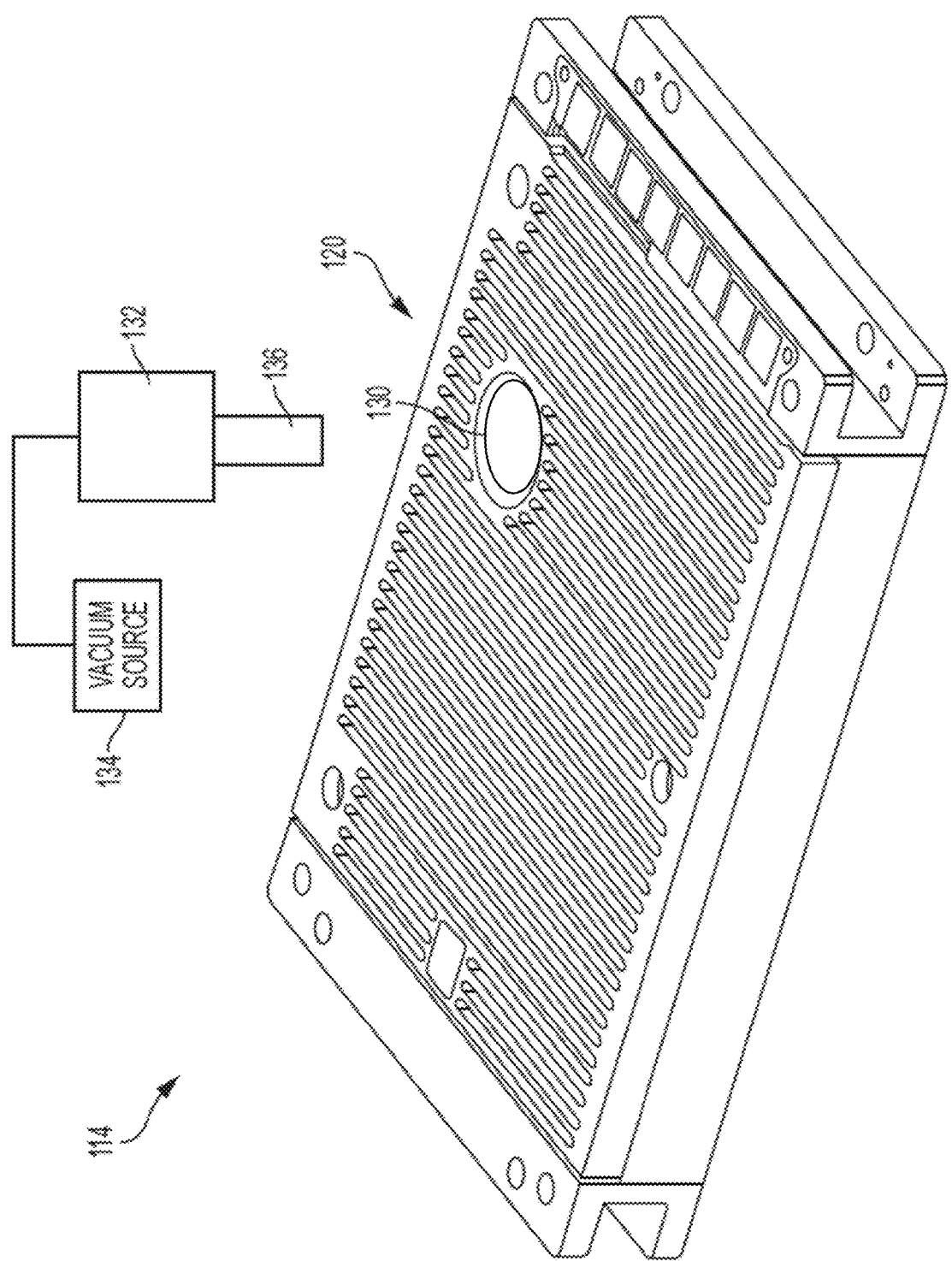
FIG. 2 shows a perspective view of a test deck for use in a data storage component testing system, in accordance with certain embodiments of the present disclosure.

The loader assembly 106 can have one or more robotic or manual rails, conveyors, end effectors, elevators, etc., that allow individual test decks 114 (shown in more detail in FIG. 2) to be installed and subsequently removed from the respective test slots 112. The ability to simultaneously test multiple test decks 114 positioned within the test slots 112 in the testing rack 104 allows for efficient testing of a large number of data storage components. The test deck 114 can include an access port 120, a media 122, a slider 124, a controller 126, and a connector 128, among other features and components.

The controller 126 is configured to store various testing routines that can be carried out while the test deck 114 is positioned within the test slot 112 to evaluate the quality and accuracy of the medium 122 and slider 124, for example. While in the test slot 112, the test deck 114 can be subjected to a variety of testing conditions including different temperature, vibration, data writing, data reading, fly height, internal gas composition, and internal gas pressure conditions. The test deck's various connectors 128 are configured to mechanically and/or electrically couple the test deck 114 to features in the test slot 112.

It is noted that the test deck 114 is not a consumer data storage device such as a hard drive but instead is a testing platform that enables simultaneous testing of individual data storage components, such as sliders and data storage media that are to be later installed in hard drives. The test deck 114 includes an enclosed testing region accessed via the access port 120 (shown in FIG. 1 and FIG. 2), which allows for efficient removal of tested data storage components and installation of untested components when compared to testing procedures requiring disassembly and assembly of data storage devices.

The exchange assembly 110 can be configured with manual or robotic means to engage and open the access port 120 of the test deck 114 before replacing one or more components housed within the test deck 114 and closing the access port 120. The access port 120 may include a door 130, which is configured to be opened and closed and which can reduce the risk of particulate generation and contamination in the enclosed testing region. It is noted that opening and closing the access port 120 via the door 130 can be accomplished pneumatically, hydraulically, and manually through friction, fasteners, and/or magnets.

The exchange assembly 110 can include one or more end effectors 132 (shown in FIG. 2 and which can be coupled to a vacuum source 134) that can be moved within the exchange assembly and used to open and close the access port 120 and/or position a data storage component such as a slider in or out of the test deck 114. Using sliders as an example, the end effector 132 can pick up a to-be-tested slider and position itself above the access port 120. The door 130 of the access port 120 can be opened, and a tip 136 of the end effector 132 can be moved through the access port 120. The to-be-tested slider can be coupled (e.g., clamped) to a slider test socket (described in more detail below) positioned in the test deck 114, and vacuum pressure can be removed to decouple the end effector 132 from the slider. In some embodiments, the vacuum pressure is maintained while the slider is being clamped to the slider test socket; in other embodiments, the vacuum pressure is released prior to clamping. Once the tip 136 of the end effector 132 is removed from the test deck 114, the door 130 of the access port 120 can be closed. The test deck 114 can then be transferred to a test slot 112, and the slider can undergo one or more testing routines. Once the slider has been tested, the test deck 114 can be transferred to the exchange assembly 110, where the door 130 of the access port 120 is opened to permit the end effector 132 to remove the slider from the test deck 114.

Some of the concerns when coupling the to-be-tested slider to a slider test socket are the position of the slider with respect to the slider test socket and the quality of the coupling force. For example, in the process of coupling the slider to the test socket, the slider may become undesirably rotated or tilted with respect to the slider test socket. Positioning errors can cause issues with mechanical and electrical coupling between the slider and slider test socket. Certain embodiments of the present disclosure are accordingly directed to methods and devices that assist with coupling sliders to slider test sockets.

Figure 3:
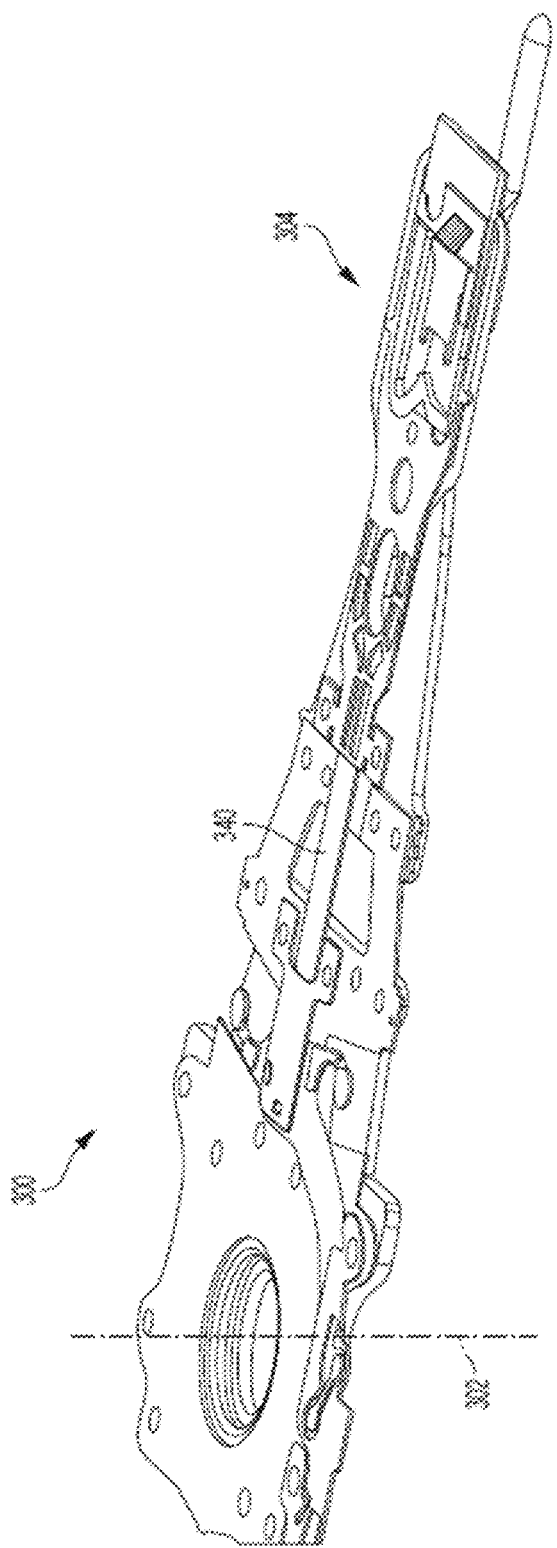
FIG. 3 shows a perspective view of a test arm, in accordance with certain embodiments of the present disclosure.

FIG. 3 shows a perspective view of a test arm 300 for use with a data storage component testing system, such as the data storage component testing system 100. As described above, data storage component testing systems can include test decks that house various data storage components—some of which are temporarily mounted to the test deck during testing. The test arm 300 can be used in a test deck, such as the test deck 114 shown in FIG. 2, and used to temporarily and/or releasably receive one or more sliders for testing. During testing, the test arm 300 can be actuated to rotate about axis 302 to position a slider over a data storage medium for test data reading/writing operations.

Figure 4:
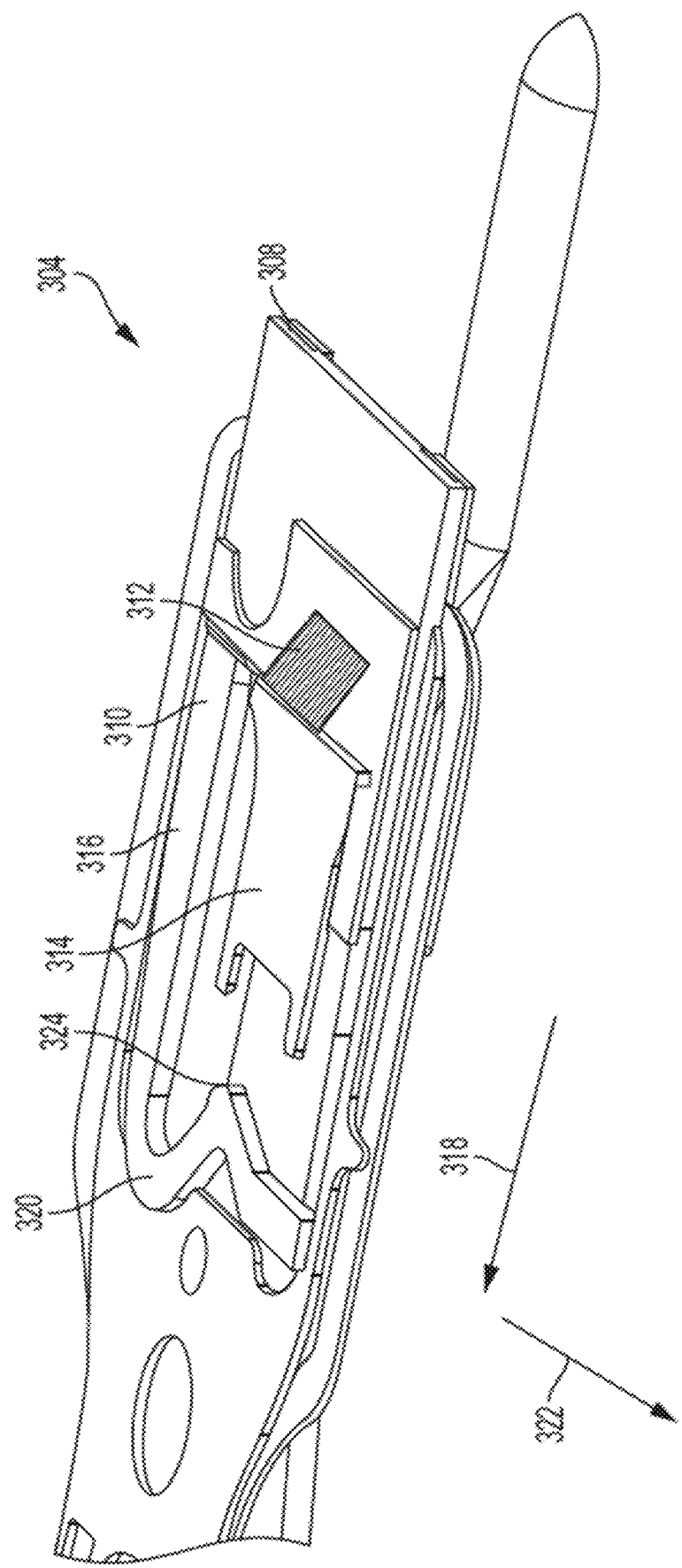
FIG. 4 shows a perspective view of a slider test socket, in accordance with certain embodiments of the present disclosure.
Figure 5:
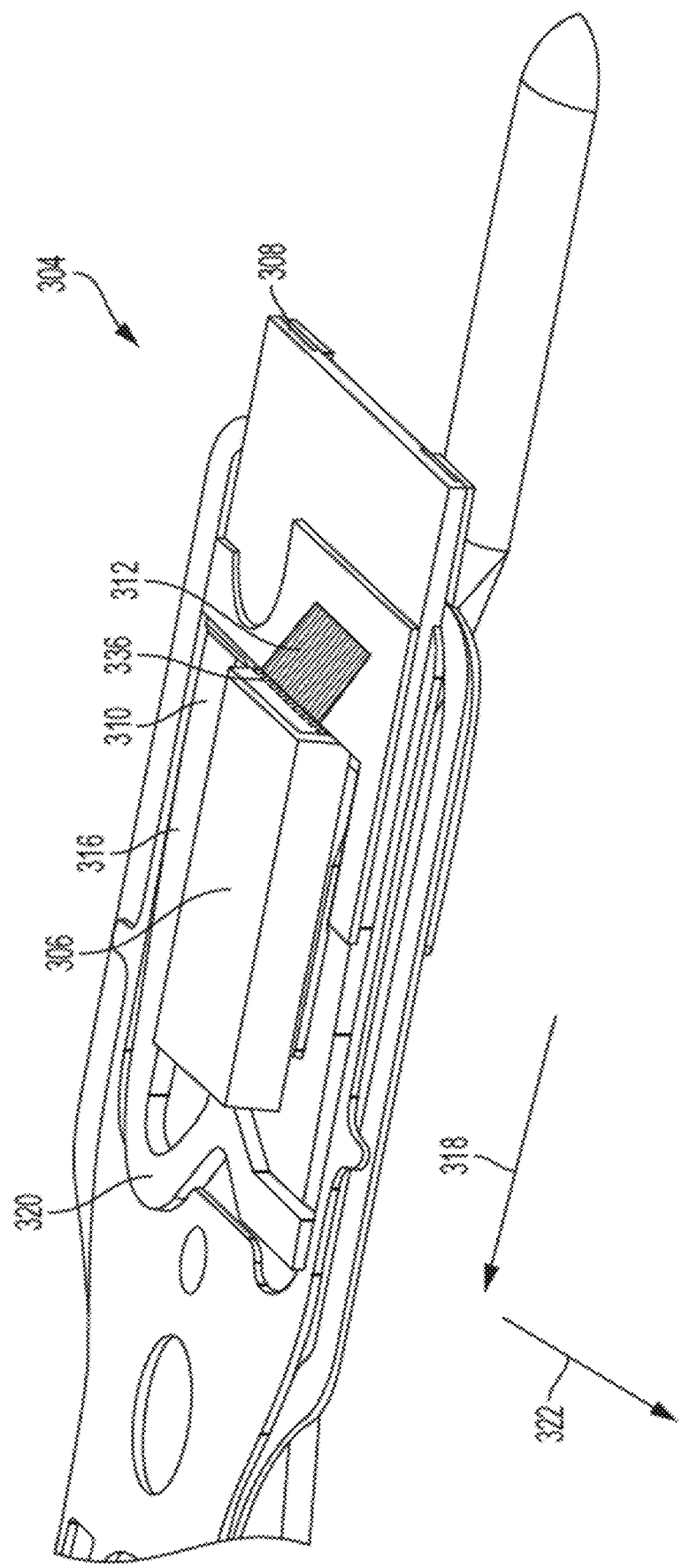
FIG. 5 shows a perspective view of the slider test socket of FIG. 4 and a slider, in accordance with certain embodiments of the present disclosure.
Figure 6:
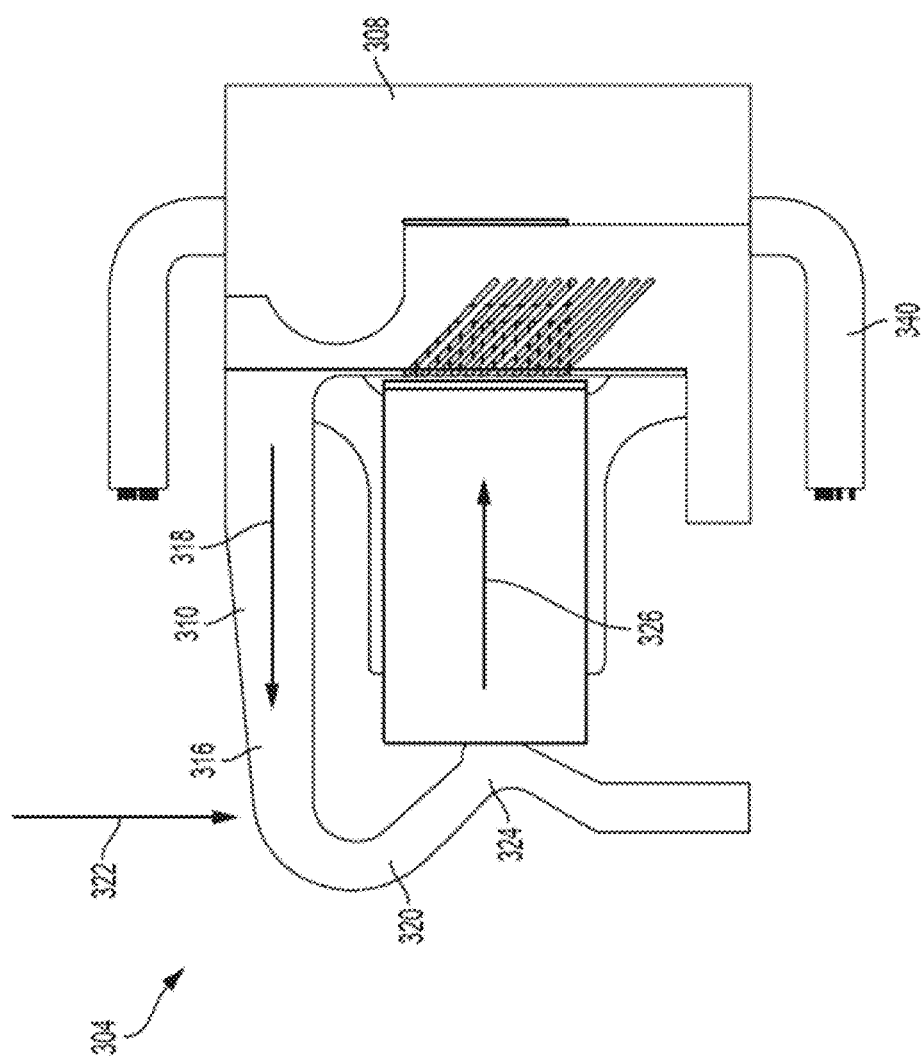
FIG. 6 shows a top view of the slider test socket and the slider of FIG. 5, in accordance with certain embodiments of the present disclosure.
Figure 7:
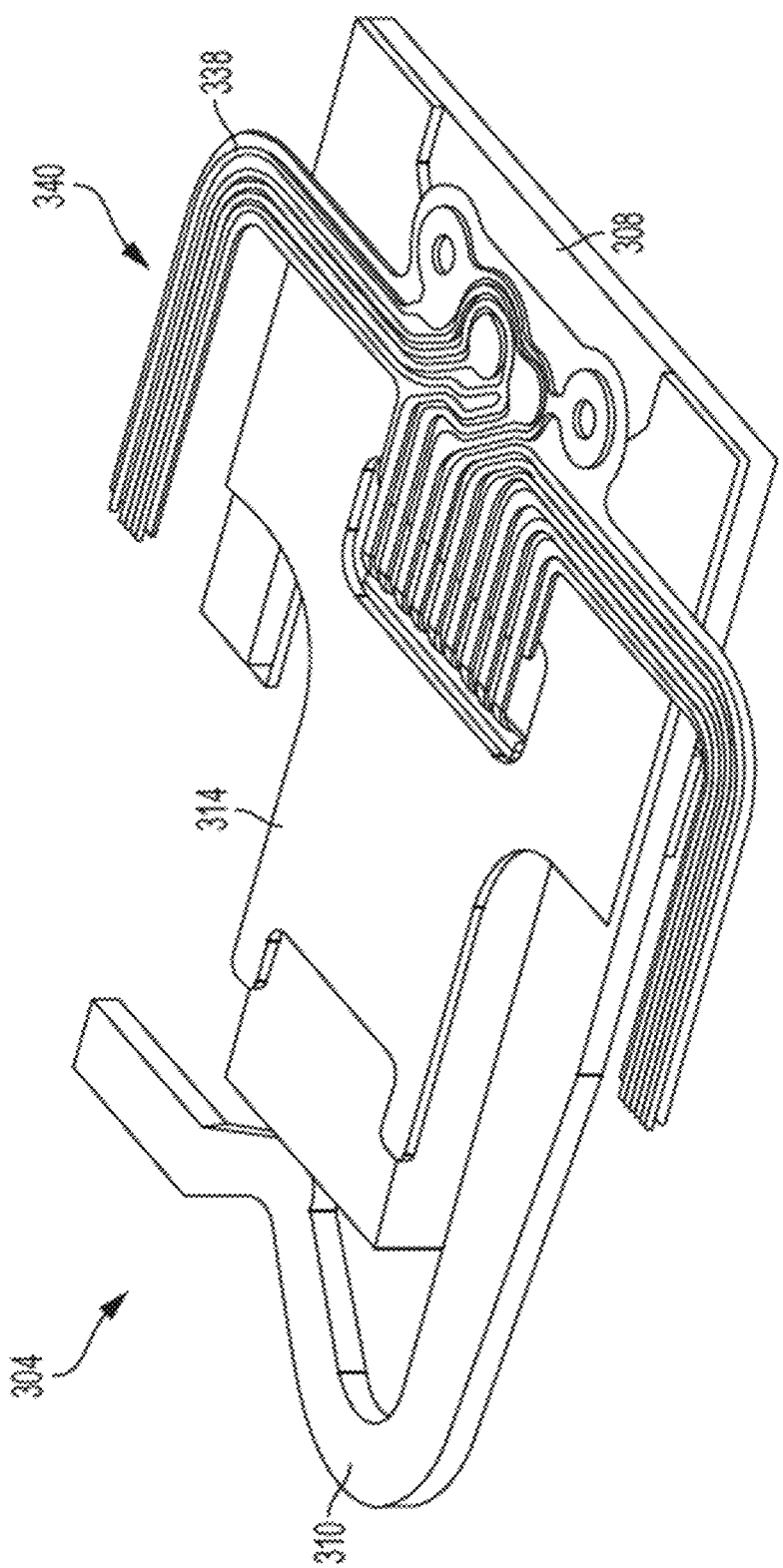
FIG. 7 shows a perspective, bottom view of the slider test socket and the slider of FIG. 6, in accordance with certain embodiments of the present disclosure.

The test arm 300 includes a slider test socket 304, which is positioned near a distal end of the test arm 300. FIG. 4 shows a zoomed-in, perspective view of the slider test socket 304. FIG. 5 shows a zoomed-in, perspective view of the slider test socket 304 and a slider 306 clamped by the slider test socket 304. FIG. 6 shows a top view of the slider test socket 304 and the slider 306. FIG. 7 shows a perspective, bottom view of the slider test socket 304 and the slider 306.

The slider test socket 304 is configured to temporarily clamp sliders during testing in a data storage component testing system such as the data storage component testing system 100. When the slider 306 is properly clamped in the slider test socket 304, the slider 306 is mechanically and electrically coupled to the slider test socket 304.

As shown in FIG. 4, the slider test socket 304 includes a clamp (e.g., a clamp body 308 and a clamp arm 310), an electrical connector 312, and a shelf 314. The clamp body 308 and the clamp arm 310 can be a unitary structure and can be made of materials including stainless steel, copper, elastomers, etc., which permit the clamp arm 310 to deflect in response to an exerted force. A clamp body 308 and clamp arm 310 made of a unitary structure can allow for the slider test socket 304 to be designed with tighter tolerances over multi-piece structures because the unitary structure eliminates the need to address tolerances due to welds, fasteners, etc. The clamp arm 310 extends from the clamp body 308 along a plane and can take various shapes. In some embodiments, like those shown in FIGS. 4-7, the clamp arm 310 is substantially L-shaped such that the clamp arm 310 includes a first portion 316 that extends from the clamp body 308 in a first direction 318 and a second portion 320 that extends from the first portion 316 in a second direction 322 that is perpendicular to the first direction 318. Together, the clamp body 308 and the clamp arm 310 form a C-clamp-like structure for clamping sliders.

Figure 8:
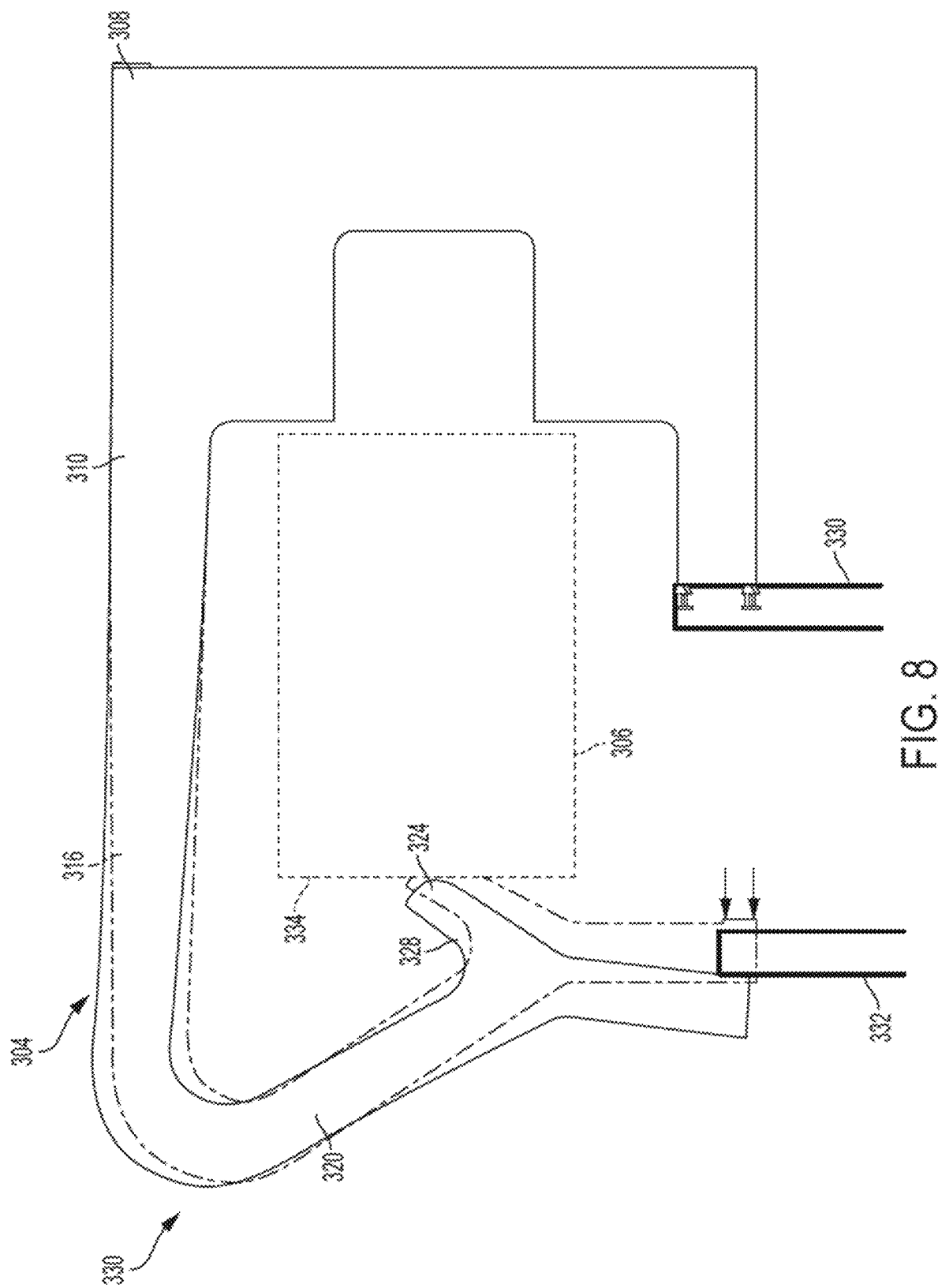
FIG. 8 shows a clamp, during deflection, that can be incorporated into slider test sockets, in accordance with certain embodiments of the present disclosure.

The slider 306 can be mechanically coupled to the slider test socket 304 in a variety of ways. FIGS. 5-7 show the slider 306 in a clamped position where the slider 306 is positioned and mechanically coupled between the clamp body 308 and the clamp arm 310. More specifically, FIG. 6 shows that the clamp arm 310 includes a contact feature 324 that extends towards the clamp body 308 and directly contacts one side of the slider 306 at or near a central longitudinal axis 326 of the slider 306 while the opposite side of the slider 306 contacts the clamp body 308. The contact feature 324 can take a variety of shapes. For example, FIGS. 3-7 show the contact feature 324 being a bump-like shape. FIG. 8 shows the contact feature 324 being formed by a leg 328 protruding from the clamp arm 310. More specifically, FIG. 8 shows the clamp arm 310 having a Y-shaped portion where one of the legs 328 of the Y-shape is the contact feature 324.

In some embodiments, the contact feature 324 includes a single, discrete contact point that is configured to contact the slider 306. In some embodiments, the contact feature 324 includes a flat surface, which lies against and contacts the slider 306. In some embodiments, the clamp arm 310 includes multiple contact features. In such embodiments, the contact features may be positioned to contact the slider away from the slider's central longitudinal axis 326 and/or at equal distances from the central longitudinal axis 326.

As mentioned above, the slider test socket 304 is configured to temporarily and/or releasably clamp one or more sliders 306 for testing. In the process of clamping a slider 306, the test deck 114 can be provisioned with at least one member that is configured to exert a force on the clamp body 308 and/or clamp arm 310 to deflect the clamp arm. FIG. 8 shows a first member 330 and a second member 332 positioned in a gap between the clamp body 308 and the clamp arm 310. The first and second member, 330 and 332, can be configured to exert a force against the clamp body 308 and the clamp arm 310, respectively. In some embodiments, the first and second members, 330 and 332, include shape-memory alloys or are actuated by one or more shape-memory alloys. In some embodiments, the force on the clamp body 308 and/or clamp arm 310 to deflect the clamp arm is caused by stepper motors with a lead screw. In some embodiments, the first member 330 and the second member 332 are actuated to exert their respective forces against the clamp body 308 and the clamp arm 310 upon the test deck's door 130 opening. In some embodiments, first and second members are actuated upon the test deck 114 being powered on in the exchange assembly 110.

FIG. 8 shows the clamp arm 310 in a deflected state such that the slider 306 can be positioned between the clamp body 308 and the clamp arm 310. Upon placing the slider 306 between the clamp arm 310 and the clamp body 308 in a clamping space 334, one or more of the forces exerted by the first and second members (e.g., engagement members), 330 and 332, can be released and the clamp arm 310 retracts to its normal state. When the one or more forces are released, the contact feature 324 contacts the slider 306 and exerts a force such that the slider 306 becomes mechanically coupled between the clamp body 308 and the clamp arm 310. In some embodiments, the clamp arm 310 and the contact feature 324 are designed such that the contact feature 324 moves along a straight line as the clamp arm 310 is deflected and retracted. This arrangement mitigates alignment and positioning problems as the slider 306 is clamped because the contact feature 324 contacts the slider and exerts a force directly towards the clamp body 308 with little to no rotational force. In some embodiments, the force exerted by the contact feature 324 is directed along the central longitudinal axis 326 of the slider 306. In some embodiments, the contact feature 324 provides a uniform force for coupling to the electrical connector 312.

Once the slider 306 is mechanically coupled to the slider test socket 304, the slider can be electrically coupled to the electrical connector 312. For example, one of the first and second members, 330 and 332, can exert a force against the electrical connector 312 to retract the electrical connector 312 away from the slider 306 while the slider 306 is being positioned in and mechanically coupled to the slider test socket 304. Once the slider 306 is mechanically coupled to the slider test socket 304, the force against the electrical connector 312 from one of the of the first and second members, 330 and 332, can be released such that the electrical connector 312 moves towards the slider 306 and electrically couples to the slider 306. Mechanically coupling the slider 306 to the slider test socket 304 before electrically coupling the slider 306 to the electrical connector 312 helps mitigate positioning errors of the slider 306 with respect to the slider test socket 304. For example, using the above-described approach, the slider 306 is less likely to become misaligned or lifted by the action of electrically coupling the slider 306 to the electrical connector 312. Conversely, in some embodiments, the slider test socket 304 is configured such that electrical connector 312 becomes electrically uncoupled from the slider 306 before the slider 306 is mechanically uncoupled from the slider test socket 304.

As shown in FIG. 5, the slider 306 includes bond pads 336 that are configured to be electrically coupled to corresponding conductors on the electrical connector 312. The electrical connecter 312 can take the form of a variety of types of connectors that configured to mechanically and electrically couple to the bond pads 336. For example, the electrical connecter 312 can be a flex circuit, featherboard-like connector, etc., and have electrical conductors such as pins that couple to the bond pads 336. Each electrical conductor forms part of or is coupled to conductors 338 (shown in FIG. 7) that communicate signals to and from the slider 306. The conductors 338 can be part of a flex circuit 340 that extends from the slider test socket 304 along the test arm 300 to the test deck's controller 126.

Figure 9:
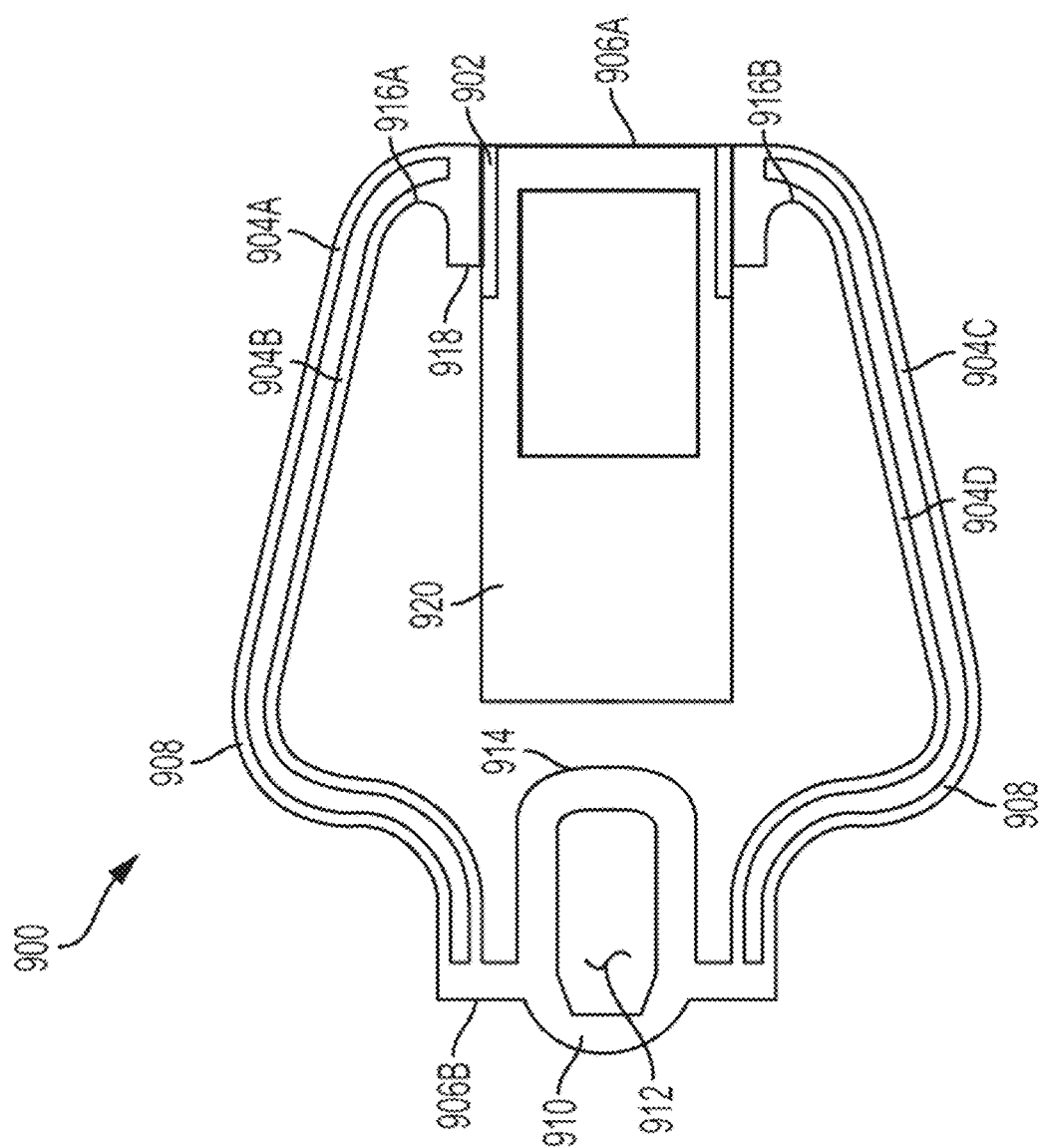
FIG. 9 shows a clamp that can be incorporated into slider test sockets, in accordance with certain embodiments of the present disclosure.

FIG. 9 shows a clamp 900 that can be incorporated into a slider test socket (e.g., slider test socket 304), according to some examples. The clamp 900 can be used to mechanically couple and decouple sliders (e.g., slider 306) to and from slider test sockets. In certain embodiments, the clamp can be a unitary structure and can be made of metals, metal alloys, or elastomers. For example, materials can include stainless steel, copper (including copper alloys), nickel (including nickel alloys like nickel-cobalt), palladium, cobalt, titanium, aluminum, bronze, brass, etc., which permit the clamp arm to deflect in response to an exerted force. In certain embodiments, the material is chosen to have a yield strength that is greater than applied stresses caused by opening the clamps when positioning a slider within the clamp. In certain embodiments, the clamps are designed to be opened 120-150 μm without exceeding the yield strength of the chosen material(s) of the clamps.

As shown, clamp 900 includes a clamp body 902 and a plurality of clamp arms (i.e., a first clamp arm 904A, a second clamp arm 904B, a third clamp arm 904C, and a fourth clamp arm 904D) that extends between a trailing end 906A (which corresponds with a trailing edge of a slider) and a leading end 906B (which corresponds with a leading edge of a slider) of the clamp 900. The first clamp arm 904A and the second clamp arm 904B are paired on one side of the clamp 900 with a gap therebetween, and the third clamp arm 904C and the fourth clamp arm 904D are paired on the other side of the clamp 900 with a gap therebetween. The arms are similarly shaped such that the arms extend from the trailing end 906A and extend away from the clamp body 902 until respective curved portions 908 of the clamp arms. At the curved portion 908, the clamp arms extend back towards the clamp body 902 until terminating at the leading end 906B. As shown in FIG. 9, the arms extend around at least a portion of the clamp body 902. Although FIG. 9 shows the arms extending along the clamp in pairs, fewer or more arms can be used. For example, additional arms can be used to increase the clamping force of the clamp 900.

The clamp 900 includes—at or near the leading end 906B—a handle 910 with an opening 912 and a contact feature 914. The clamp 900 also includes engagement surfaces 916A and 916B on the second clamp arm 904B and the fourth clamp arm 904D, respectively. Near the trailing end 906A, the clamp 900 includes a slider support surface 918. The clamp 900 also includes a shelf 920.

To couple a slider to the clamp 900, a first member (e.g., engagement member) can extend through the opening 912 in the handle 910 and a second member (e.g., engagement member) can couple to one or both of the engagement surfaces 916A and 916B. Once positioned, the engagement members can exert a force to create a larger gap between the contact feature 914 and the slider support surface 918. The shape of the arms allows the clamp 900 to lengthen such that a slider can be positioned on the shelf 920 and between the contact feature 914 and the slider support surface 918. Once the slider is positioned, the engagement members can remove the force against the opening 912 and the engagement surfaces 916A and 916B such that the contact feature 914 and the slider support surface 918 couple to the slider (e.g., slider 306).

Figure 10:
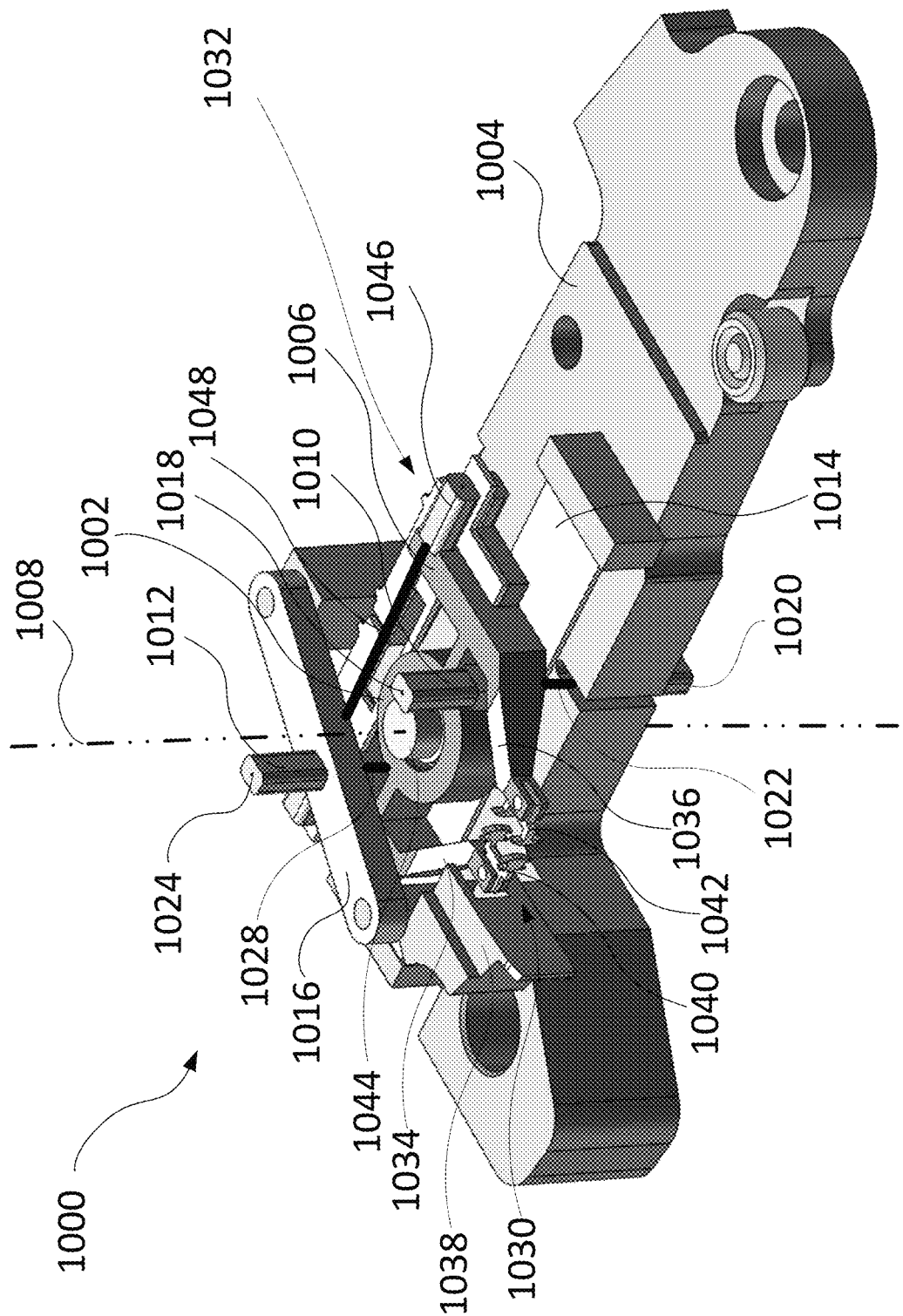
FIG. 10 shows an opener assembly, in accordance with certain embodiments of the present disclosure.

FIG. 10 shows an opener assembly 1000 configured to be incorporated into a test deck (e.g., test deck 114), in accordance with certain embodiments of the present disclosure. The opener assembly 1000 includes an actuator assembly 1002 and a base 1004. The actuator assembly 1002 includes an actuator body 1006 and may be configured to be moved along axis 1008. For example, the actuator assembly 1002 may be moved by actuating one or more base actuators, such as a first base actuator 1010 and/or a second base actuator 1012. The first and second base actuators 1010, 1012 may be operatively coupled to the actuator assembly 1002 via a transporting element 1014.

In the illustrated example, the base actuators 1010, 1012 (depicted as linear actuators) are coupled to the transporting element 1014 (depicted as a tab or plate) that is in contact with the actuator body 1006 (e.g., a bottom surface of the actuator body 1006) such that movement of the transporting element 1014 caused by actuation of the first and/or second base actuators 1010, 1012 will induce movement of the actuator assembly 1002. The base 1004 may further include a bar member 1016 coupled to the base actuator 1012.

In various embodiments, each of the base actuators 1010, 1012 includes a first end coupled to a second end via an actuation wire. For example, the first base actuator 1010 includes a first end 1018 and a second end 1020 coupled to each other via an actuator wire 1022, and the second base actuator 1012 includes a first end 1024 coupled to a second end (not shown) via an actuation wire 1028. The actuation wires 1022, 1028 may be shape memory alloy-based (SMA) wires that shorten when electrical current is applied through the wires. For example, SMA wires may have a negative coefficient of thermal expansion that causes the SMA wires to shorten with their temperature increases. As such, either end of the base actuators 1010, 1012 can be actuated to be pulled closer to the other end such that the actuator assembly 1002 moves along the axis 1008. The base actuators 1010, 1012 may also be biased towards an unactuated state (e.g., extended state) and configured to return to the unactuated state upon terminating the actuation (e.g., terminating current supplied to SMA wires). For example, the actuator body 1006 may be configured to be biased in an unactuated state. In certain embodiments, the base actuators 1010, 1012 include motors (e.g., servo/stepper motors) that cause the actuator assembly 1002 to move along the axis 1008.

As shown, the actuator body 1006 has a first or distal end 1030, a second or proximal end 1032, a first arm 1034 (also referred to as first opener arm), and a second arm 1036 (also referred to as second opener arm). The first and second arms 1034, 1036 extend between from the distal end 1030, and as in the illustrated example, may define a first spacing (shown more clearly in the example in FIG. 11) near the distal end 1030 in an unactuated state. As will be described below, the size of the spacing will enlarge when the actuator assembly 1002 is in an actuated state. The first and second arms 1034, 1036 may be fixedly coupled to an arm receiving structure 1038 of the base 1004.

The first arm 1034 includes a first engagement member 1040 at or near the distal end 1030 and that is configured to engage a clamp (e.g., clamp 900). Similarly, the second arm 1036 includes a second engagement member 1042 at or near the distal end 1030 and configured to engage a clamp (e.g., clamp 900). Further examples of engagement members will be described with respect to FIGS. 17, 18A, and 18B. These engagement members can be used with the features of FIG. 10.

The first engagement element 1040 and the first arm 1034 may be a unitary structure, and the second engagement element 1042 and the second arm 1036 may be a unitary structure. In some embodiments, the first engagement element 1040 may be removably coupled to the first arm 1034, and the second engagement element 1042 may be removably coupled to the second arm 1036. The actuator body 1006 may be coupled to the base 1004 (e.g., by a coupling member 1044), such as fixedly coupled to the base 1004 such that at least a portion (e.g., a central portion) of the actuator body remains generally stationary upon actuation of the opener actuator 1046.

As shown in FIG. 10, an opener actuator 1046 is coupled to the first and second arms 1034, 1036 at or near the proximal end 1032. The opener actuator 1046 may be generally similar to the base actuators 1010, 1012. For example, the opener actuator 1046 may include a SMA wire 1048 and/or a motor. When the opener actuator 1046 is actuated (e.g., the SMA wire 1048 shrinks) to the actuated state, the first and second arms 1034, 1036 at the proximal end 1032 move closer to each other while the first and second arms 1034, 1036 at the distal end 1030 move farther apart from each other. As such, the spacing between the first and second arms 1034, 1036 at the distal end 1030 increases. As will be described in more detail below, this actuation assists with opening a clamp in a test deck.

Figure 11:
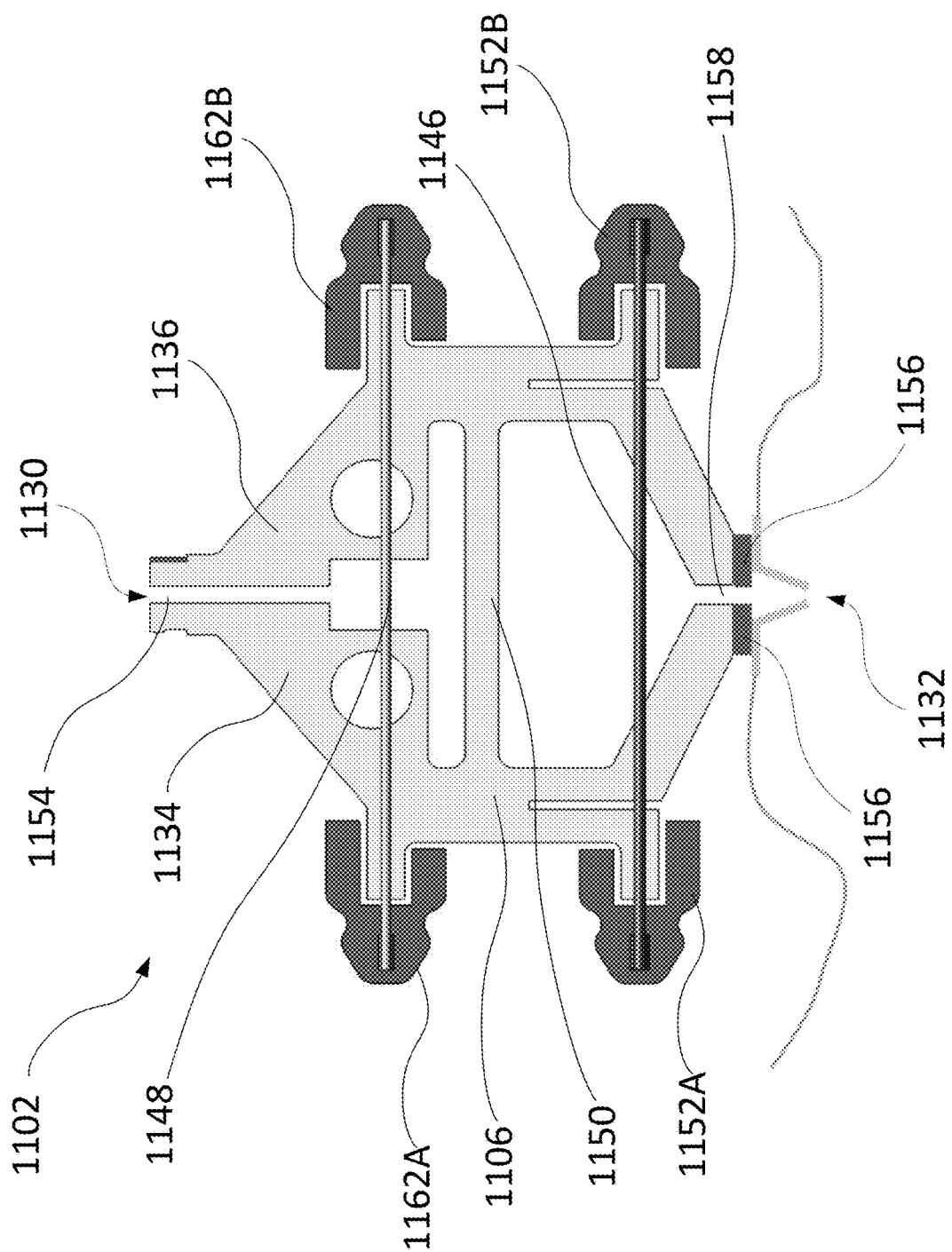
FIG. 11 shows an actuator assembly, in accordance with certain embodiments of the present disclosure.
Figure 12:
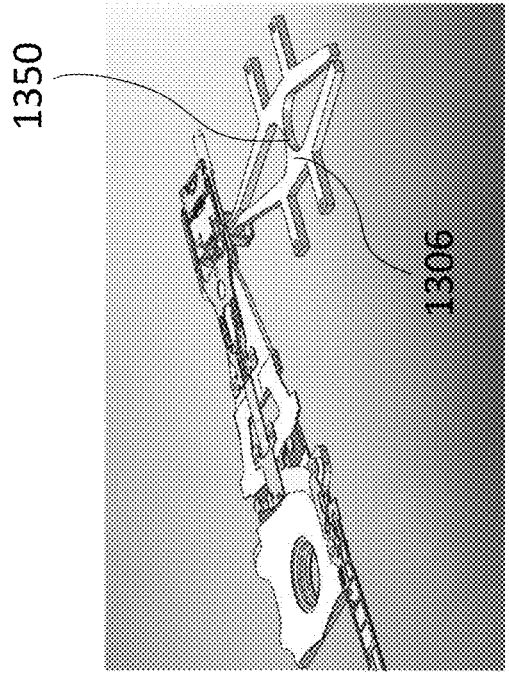
FIGS. 12-15 show various one-piece actuator bodies, in accordance with certain embodiments of the present disclosure.
Figure 13:
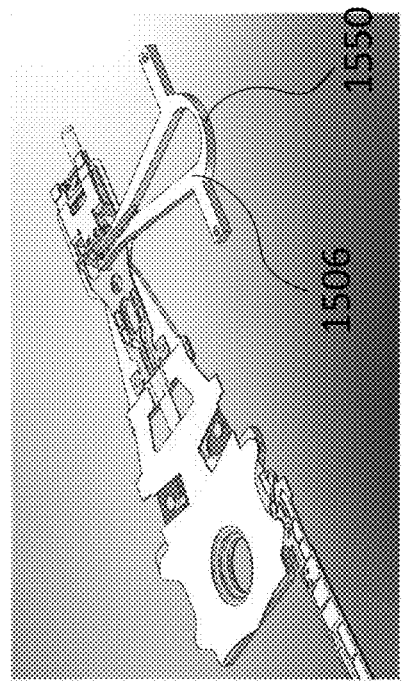
Figure 14:
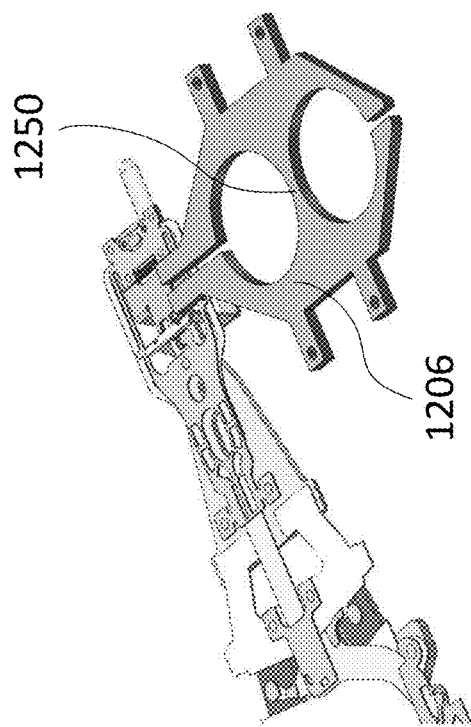
Figure 15:
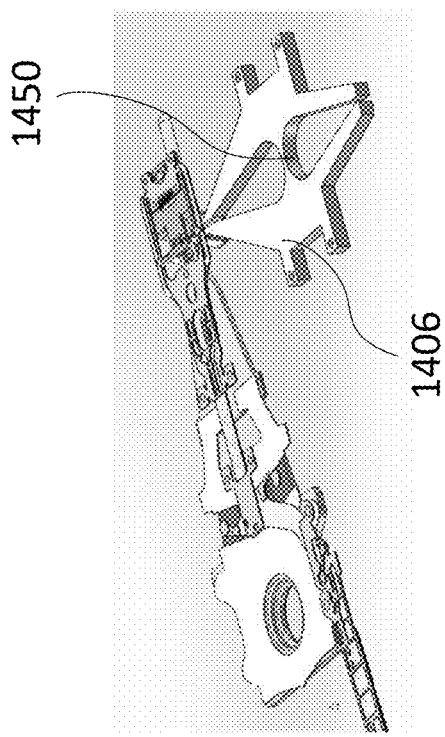

FIG. 11 shows an actuator assembly 1102, in accordance with certain embodiments of the present disclosure. The actuator assembly 1102 may include similar features and perform similar functions as the actuator assembly 1002 of FIG. 10. Similarly, the actuator assembly 1002 may alternatively or additionally include features and elements of the actuator assembly 1102. In the illustrated example, the actuator assembly 1102 includes an actuator body 1106 which has a distal end 1130, a proximal end 1132, a first arm 1134, and a second arm 1136. The actuator assembly 1102 may include a central region 1150 configured to be coupled to a base (e.g., base 1004), such as via snap-fitting, fastening, or other coupling means.

As shown, the actuator assembly 1102 may include a first opener actuator 1146 (e.g., proximal to the central region 1150) having first and second ends 1152A, 1152B and coupled to the arms 1134, 1136. The first and second ends 1152A, 1152B are coupled via an actuator wire. The first opener actuator 1146 is positioned such that upon actuation, the proximal gap 1158 between the arms near the proximal end 1132 narrows and in turn causes the distal gap 1154 between the arms near the distal end 1130 to widen. The actuator assembly 1102 may further include a second opener actuator 1148 (e.g., distal to the central region 1150) having first and second ends 1162A, 1162B and coupled to the arms 1134, 1136 such that upon actuation, the distal gap 1154 narrows and the proximal gap 1158 widens. The opener actuators 1146, 1148 may each help transition from the opened state to the closed state and/or from the closed state to the opened state.

Additional opener actuators may be included to help modify stroke (e.g., degree of arm movement), actuation time, recover time, cycling hysteresis, and/or actuation force. For example, additional opener actuators may enable the use of thinner actuation wires (e.g., SMA wires) which have faster expansion and contraction responses than thicker wires, while maintaining sufficient actuation force due to the increased quantity of wires. The use of additional opener actuators may also reduce cycling hysteresis and/or increase service life due to reduced wear (e.g., wear from stress) experienced by each wire. The actuator assembly 1102 may further include a limiter 1156 configured to stop or limit the arms 1134, 1136 from opening beyond a target spacing (e.g., spacing between the arms at the distal gap 1154). In certain embodiments, the limiter 1156 is an electrical limit switch that generates a signal when two contacts physically contact each other. In certain embodiments, the limiter 1156 is a mechanical limiter that physically limits the extent of spacing (e.g., spacing between the arms at the distal gap 1154).

FIGS. 12-15 show various one-piece actuator bodies 1206, 1306, 1406, and 1506, in accordance with certain embodiments of the present disclosure. Similar to the actuator body 1006 (FIG. 10) and/or 1106 (FIG. 11), the actuator bodies 1206, 1306, 1406, and 1506 are configured to transition between a closed position and an opened position by actuating one or more opener actuators. Actuator bodies 1206, 1306, 1406, and 1506 may be substantially planar and/or symmetric. As shown, the illustrated actuator bodies are one-piece actuator bodies, in which the first and second arms are formed with the bodies as unitary structures. Actuator bodies 1206, 1306, 1406, and 1506 may be coupled to a base (e.g., base 1004) of an opener assembly (e.g., opener assembly 1000) at central regions 1250, 1350, 1450, and 1550. The coupling may be achieved via snap-fitting, fastening, etc.

In various embodiments, the one-piece actuator bodies 1206, 1306, 1406, and 1506 are elastically deformed upon actuation, such as elastically deformed at least at their central regions 1250, 1350, 1450, and 1550. The actuation force for an actuator assembly having a one-piece actuator body may be substantially equal to the elastic deformation force. Additionally, each of the actuator bodies 1106, 1206, 1306, 1406, and 1506 includes one or more cavities, holes, or cutouts configured to reduce the actuation force required to actuate. The actuator bodies 1106, 1206, 1306, 1406, and 1506 may comprise a compliant material such as plastic or metal (e.g., stainless steel).

Figure 16:
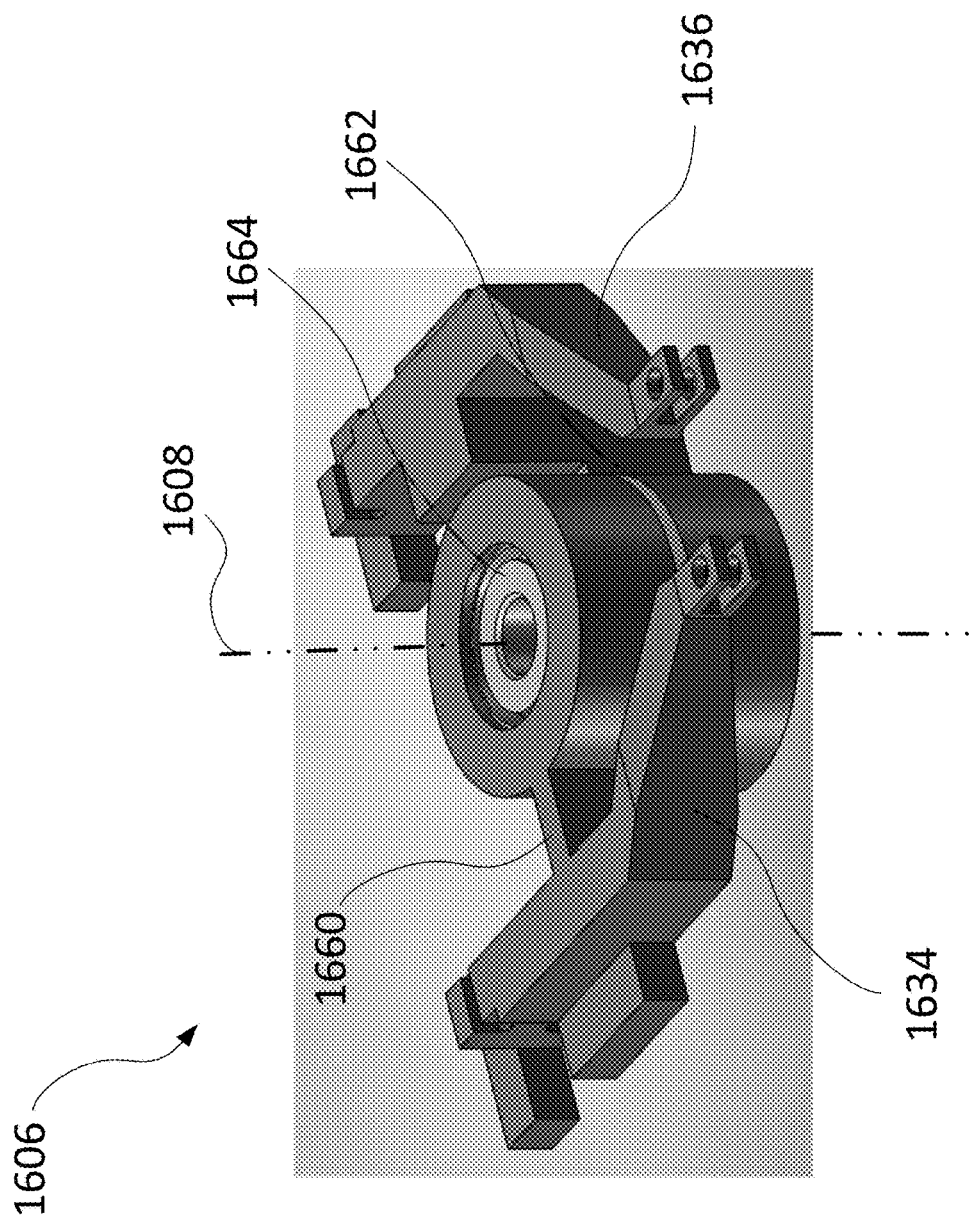
FIG. 16 shows an actuator assembly having a two-piece body, in accordance with certain embodiments of the present disclosure.

FIG. 16 shows a two-piece actuator body 1606, in accordance with certain embodiments of the present disclosure. The actuator body 1606 may include features and elements of the actuator bodies 1006, 1106, 1206, 1306, 1406, and/or 1506. Similarly, the actuator bodies 1006, 1106, 1206, 1306, 1406, and 1506 may include features and elements of actuator body 1606. In the illustrated example, the actuator body 1606 includes a first arm 1634 and a second arm 1636, which is formed as a separate component than the first arm 1634. The arms are configured to rotate (e.g., pivotably rotate) about axis 1608. The first arm 1634 is connected to the annular member via a first bridging element 1660, and the second arm 1636 is connected to an annular member via a second bridging element 1662. The actuator body 1606 may be coupled to a pivot bearing 1664, for example, by a fastener which may be used to couple the actuator body 1606 to a base (e.g., base 1004) of an opener assembly (e.g., opener assembly 1000).

In various embodiments, two-piece actuator bodies (e.g., actuator body 1606) are not deformed upon actuation like the one-piece actuators described above. Instead, the actuation force for an opener assembly having a two-piece actuator body may be less than the actuation force for an opener assembly having a one-piece actuator body. In some embodiments, an actuator body (e.g., actuator body 1606) may include a biasing mechanism (not shown) configured to bias the actuator body to either the closed position or the opened position when unactuated. The biasing mechanism may be a spring mechanism, a magnetic mechanism, etc.

Figure 17:
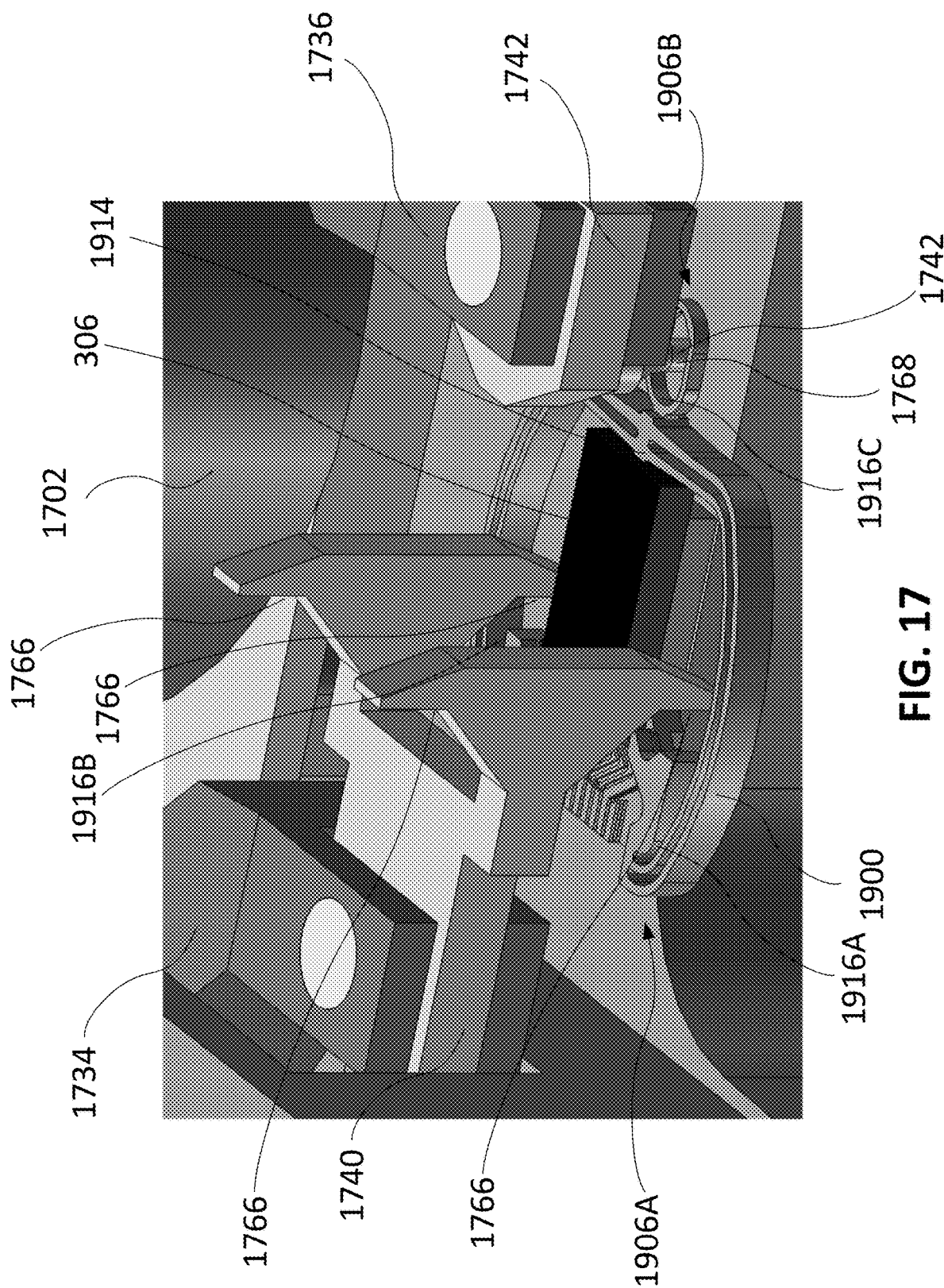
FIG. 17 shows a first engagement element and a second engagement element, in accordance with certain embodiments of the present disclosure.

FIG. 17 shows a first engagement element 1740 and a second engagement element 1742, in accordance with certain embodiments of the present disclosure. The first engagement element 1740 may be an integral part of a first arm 1734 or removably coupled to the first arm 1734. The second engagement element 1742 may be part of a second arm 1736 or removably coupled to the second arm 1736. The first engagement element 1740 includes one or more engagement surfaces 1766 configured to engage a clamp 1900 of a slider test socket of a data storage component testing system (e.g., data storage component testing system 100). Similarly, the second engagement element 1742 includes one or more engagement surfaces 1768 configured to engage the clamp 1900.

As shown, the engagement elements 1740, 1742 are not engaged (e.g., in contact) with the clamp 1900 in the closed position, in which a slider 306 is urged by a contact feature 1914 of the clamp into a testing configuration such that the slider is electrically coupled to the data storage component testing system. Upon actuation of the actuator assembly 1702, the first and second arms 1734, 1736 are configured to move apart such that the engagement elements 1740, 1742 engage with the clamp 1900 (e.g., engage with the one or more engagement surfaces of the clamp). In the illustrated example, the engagement surfaces 1766 of the first engagement element 1740 are configured to engage a first engagement surface 1916A and a second engagement surface 1916B of the clamp 1900 near the trailing end 1906A upon actuation. The engagement surface 1768 of the second engagement element 1742 is configured to engage a third engagement surface 1916C of the clamp 1900 near the leading end 1906B upon actuation. Clamp 1900 is configured to be extended or widened (i.e., increasing spacing between the trailing end 1906A and the leading end 1906B)

by forces exerted by the engagement elements 1740, 1742 such that the slider 306 may be inserted or removed from the clamp 1900.

Figure 18A:
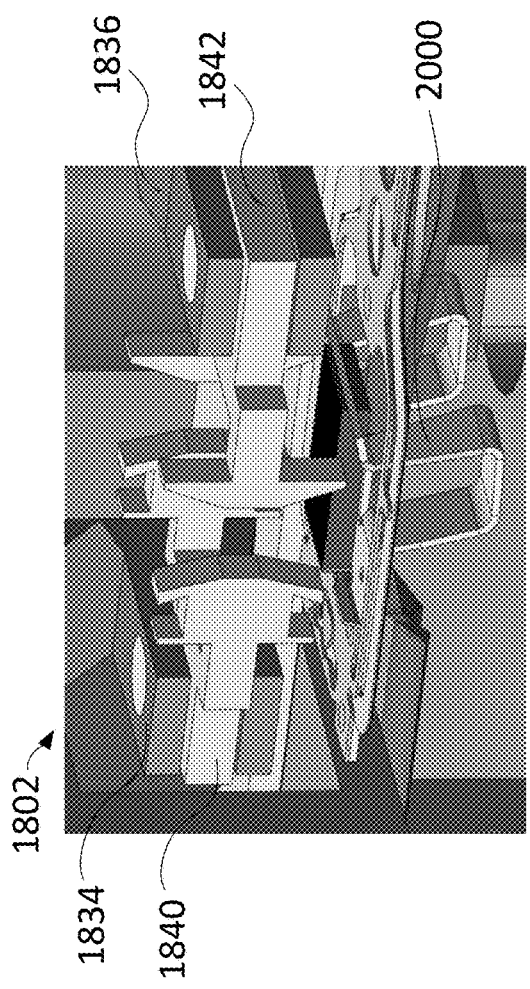
FIG. 18A shows an actuator assembly in a lifted state, in accordance with certain embodiments of the present disclosure.
Figure 18B:
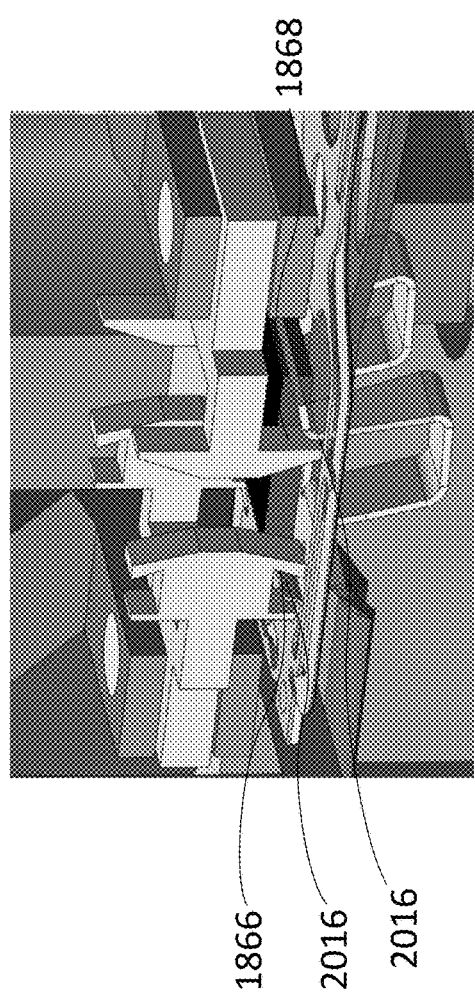
FIG. 18B shows an actuator assembly in a lowered state, in accordance with certain embodiments of the present disclosure.

FIG. 18A and FIG. 18B show an actuator assembly 1802 in a lifted state and in a lowered state, respectively, in accordance with certain embodiments of the present disclosure. As illustrated, actuator assembly 1802 includes a first arm 1834 including a first engagement element 1840, a second arm 1836 including a second engagement element 1842, and configured to engage a clamp 2000 in the opened state.

When the actuator assembly 1802 is in the lowered state or position (as in FIG. 18B), at least portions of the engagement surfaces 1866, 1868 are in plane with engagement surfaces 2016 such that the clamp 2000 may be deformed (i.e., widened or lengthened) upon actuation of the actuator assembly 1802. Transition between the listed and lowered state may be achieved via one or more base actuators similar to the base actuators 1010, 1012 described for actuator assembly 1002. The one or more base actuators may be coupled to a base to which the first and second arms are coupled to, such that the arms 1834, 1836, the engagement elements 1840, 1842, and the engagement surfaces 1866, 1868 may move vertically, such as move perpendicularly to an actuation plane defined by the arms, or such as along a longitudinal axis.

Figure 19:
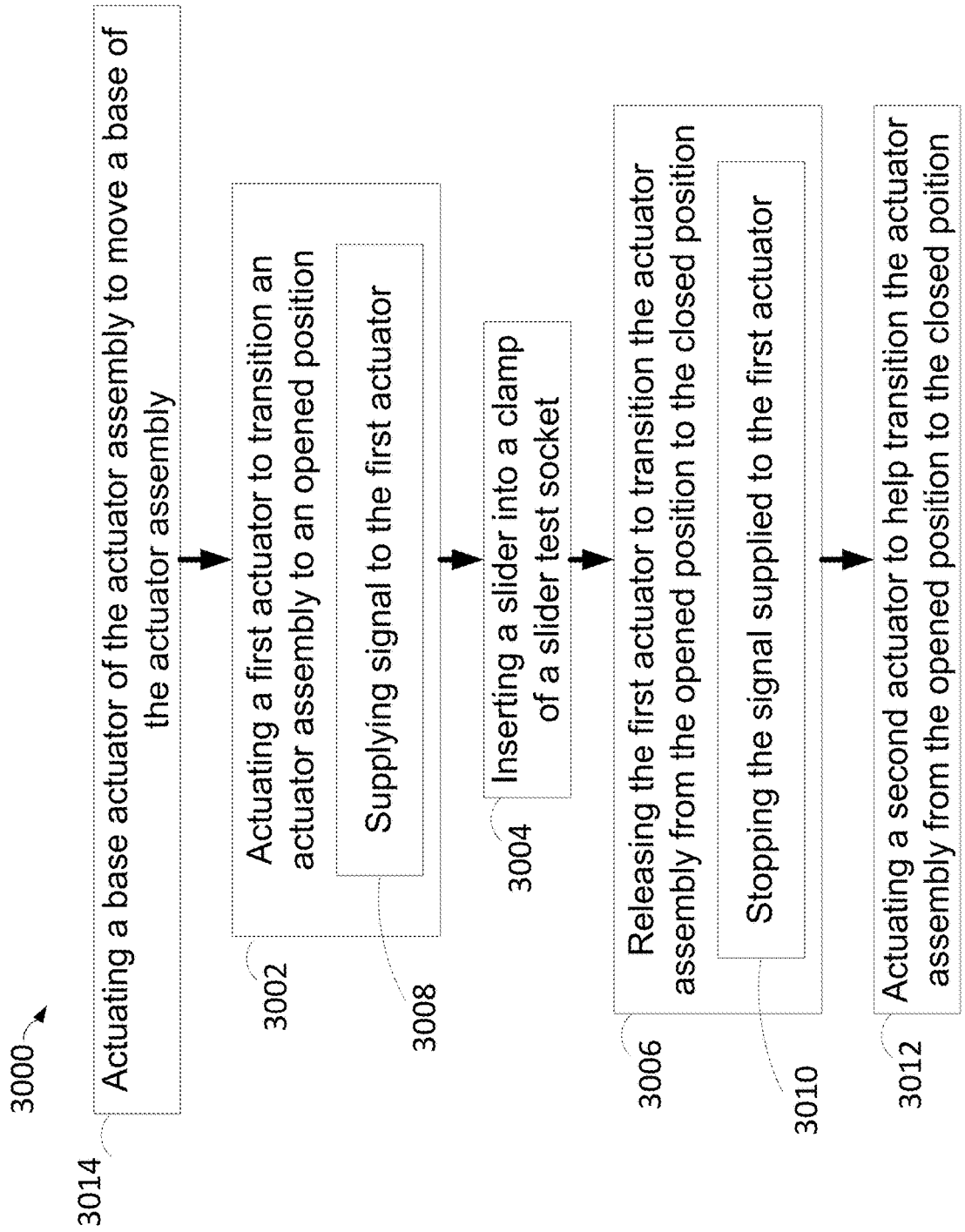
FIG. 19 depicts an illustrative method for coupling a slider to an actuation assembly, in accordance with certain embodiments of the present disclosure.

FIG. 19 depicts an illustrative method 3000 for coupling a slider (e.g., slider 306) to a data component testing system (e.g., data storage component testing system 100), in accordance with certain embodiments of the present disclosure. The method 3000 includes actuating 3002 a first actuator (e.g., the first opener actuator 1046 or 1146) to transition an actuator assembly (e.g., actuator assembly 1002, 1102, 1702, or 1802) to an opened position. The method 3000 further includes inserting 3004 the slider into a clamp (e.g., clamp 900, 1900 or 2000) of a slider test socket (of the data component testing system). The method 3000 further includes releasing 3006 the first actuator to transition the actuator assembly from the opened position to a closed position. Actuating 3002 the first actuator may include supplying 3008 an electrical signal (e.g., current) to the first actuator (e.g., SMA, servo/stepper motor) and releasing 3004 the first actuator may include stopping 3010 the electrical signal supplied to the first actuator. The method 3000 may further include actuating 3012 a second actuator (e.g., SMA, servo/stepper motor) of the actuator assembly to help transition the actuator assembly from the opened position to the closed position. The method 3000 may further include actuating 3014 a base actuator (e.g., base actuator 1010 or 1012) of the actuator assembly to move a base of the actuator assembly perpendicularly to an actuation plane defined by a first arm and a second arm of the actuator assembly.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. An opener assembly for a data storage component testing system, the opener assembly comprising:
an actuator assembly including:
a body having a distal end, a proximal end, a first arm, and a second arm, wherein the first and second arms extend between the proximal end and the distal end and define a spacing at the distal end, and
a first opener actuator comprising a shape memory alloy wire or a motor and operatively coupled to the first and second arms and configured to actuate the actuator assembly between a closed position and an opened position.

2. The opener assembly of claim 1, wherein the first arm includes a first engagement element and the second arm includes a second engagement element.

3. The opener assembly of claim 2, wherein the first engagement element is integrally formed with the first arm and the second engagement element is integrally formed with the second arm.

4. The opener assembly of claim 2, wherein the first engagement element is removably coupled to the first arm and the second engagement element is removably coupled to the second arm.

5. The opener assembly of claim 2, wherein each of the first and second engagement elements includes one or more engagement surfaces configured to engage a clamp of the data storage component testing system at least when the actuator assembly is in the opened position.

6. The opener assembly of claim 1, wherein a size of the spacing at the distal end is greater when the first opener actuator is actuated.

7. The opener assembly of claim 1, wherein the shape memory alloy wire is configured to shrink in response to an electrical signal being applied to the shape memory alloy wire.

8. The opener assembly of claim 7, wherein a size of the spacing at the distal end increases in response to the electrical signal being applied to the shape memory alloy wire.

9. The opener assembly of claim 1, further comprising:
a second opener actuator coupled to the first and second arms and configured to actuate the actuator assembly from the opened position to the closed position.

10. The opener assembly of claim 9, wherein the first opener actuator is coupled to the first and second arms near the proximal end and the second opener actuator is coupled to the first and second arms near the distal end.

11. The opener assembly of claim 1, further comprising:
a limiter configured to limit the first and second arms from opening beyond a target spacing.

12. The opener assembly of claim 11, wherein the limiter is either a mechanical limit switch or an electrical limit switch.

13. The opener assembly of claim 1, wherein the first and second arms are integrally formed.

14. The opener assembly of claim 1, wherein the first and second arms are formed as separate components.

15. The opener assembly of claim 14, wherein the first and second arms are pivotably coupled to a pivot.

16. A data storage component testing system comprising:
a test deck including a slider test socket with a clamp; and
an opener assembly including:
a first arm and a second arm configured to open and close the clamp, and
an actuator that is configured to move the first arm and the second arm into contact with the clamp to open the clamp and that is configured to move the first arm and the second arm out of contact with the clamp to close the clamp.

17. A method for using an opener assembly to couple a slider to a clamp of a slider test socket, the opener assembly including an actuator coupled to a first arm and a second arm, the first and the second arms including a spacing between respective distal ends of the first and second arms, the method comprising:

actuating the actuator, which includes either a motor or a shape memory alloy, to increase the spacing between respective distal ends of the first and second arms and to engage and open the clamp;

inserting the slider into the opened clamp; and actuating the actuator to couple the slider to the clamp.

18. The data storage component testing system of claim 16, wherein the first arm includes a first engagement element for contacting the clamp, wherein the second arm includes a second engagement element for contacting the clamp.

19. The data storage component testing system of claim 16, wherein the actuator includes either a motor or a shape memory alloy.

20. The data storage component testing system of claim 19, wherein the first engagement element is integrally formed with the first arm and the second engagement element is integrally formed with the second arm.

* * * * *